US006956242B2

(12) United States Patent
Tsutsui

(10) Patent No.: US 6,956,242 B2
(45) Date of Patent: Oct. 18, 2005

(54) SEMICONDUCTOR LIGHT-EMITTING DEVICE HAVING A SEMICONDUCTOR LIGHT-EMITTING ELEMENT MOUNTED ON A SUBSTRATE WITH ANISOTROPICALLY CONDUCTIVE ADHESIVE INTERPOSED THEREBETWEEN

(75) Inventor: Tsuyoshi Tsutsui, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 133 days.

(21) Appl. No.: 10/610,754

(22) Filed: Jul. 2, 2003

(65) Prior Publication Data

US 2005/0045899 A1 Mar. 3, 2005

(30) Foreign Application Priority Data

Jul. 5, 2002 (JP) .......................... 2002-197483

(51) Int. Cl.[7] .............................................. H01L 33/00
(52) U.S. Cl. ........................ 257/79; 257/80; 257/88; 257/99
(58) Field of Search ....................... 257/79, 80, 88, 257/99; 313/113, 114

(56) References Cited

FOREIGN PATENT DOCUMENTS

JP   2000-135814   *  5/2000

OTHER PUBLICATIONS

3M Technical data, Z–Axis Adhesive film 5303R–2, found on the Web at: http://products3.3m.com/catalog/us/en001/government/gsa/node_GS25XDFZW2be/root_GS3RBW6QFVgv/vroot_GSL4YG63GRge/gvel_087TG8C9KBgl/theme_us_gsa_3_0/command_AbcPageHandler/output_html.*

* cited by examiner

*Primary Examiner*—Minhloan Tran
*Assistant Examiner*—Thomas Dickey
(74) *Attorney, Agent, or Firm*—Arent Fox PLLC

(57) ABSTRACT

A semiconductor light-emitting element 1 is mounted on a substrate 2 with an anisotropically conductive adhesive 3, which has electrically conductive particles 32 dispersion-mixed with a thermosetting resin 31, laid between a pair of electrodes 11 and 11' formed on the same surface of the semiconductor light-emitting element and wiring electrodes 21 and 21' formed on the substrate 2. Depressions 22 and 22' are formed in the portion of the surface of the wiring electrodes 21 and 21' facing the semiconductor light-emitting element 1 so that the electrically conductive particles 32 are stably present between the pair of electrodes 11 and 11' and the wiring electrodes 21 and 21'.

8 Claims, 4 Drawing Sheets

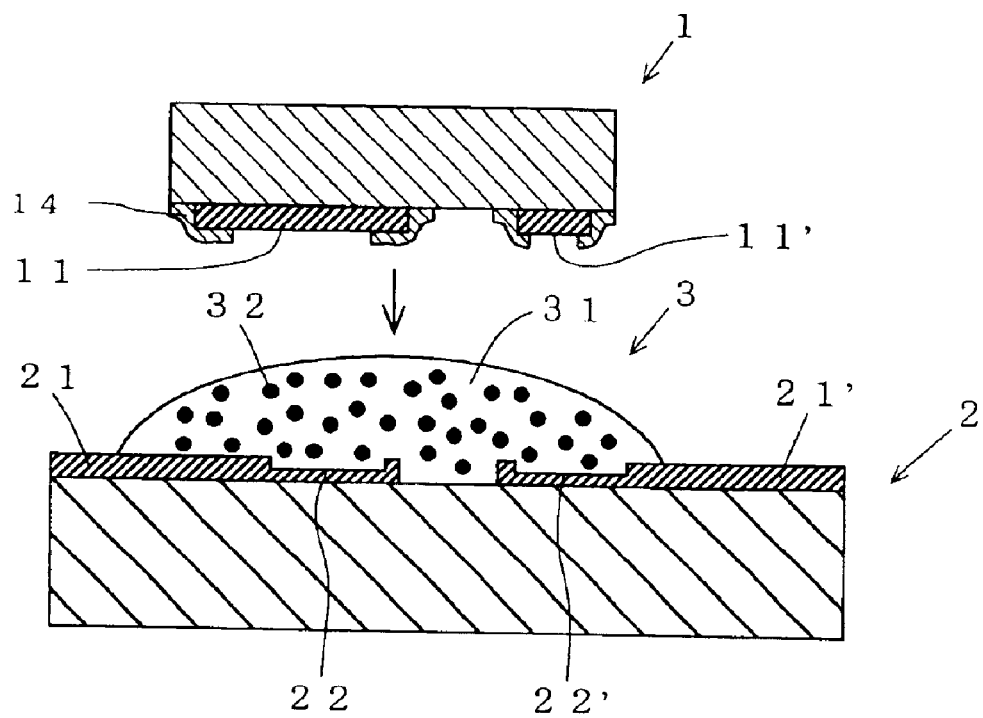
FIG. 1A
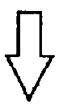
PRESSURE
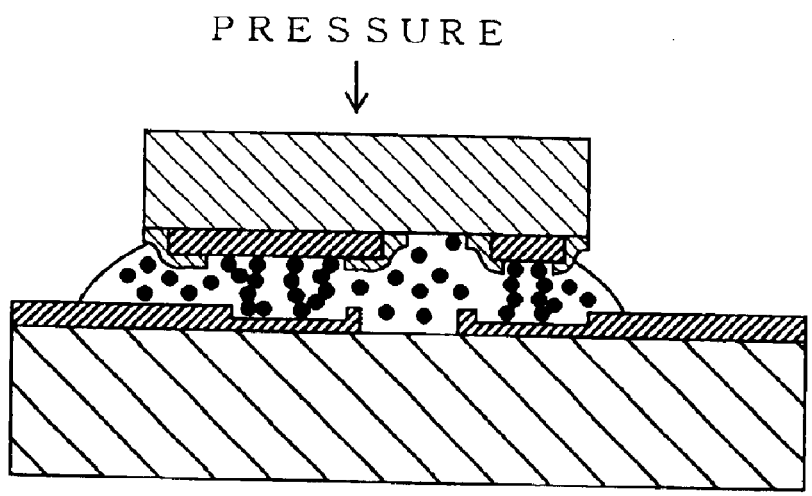
FIG. 1B

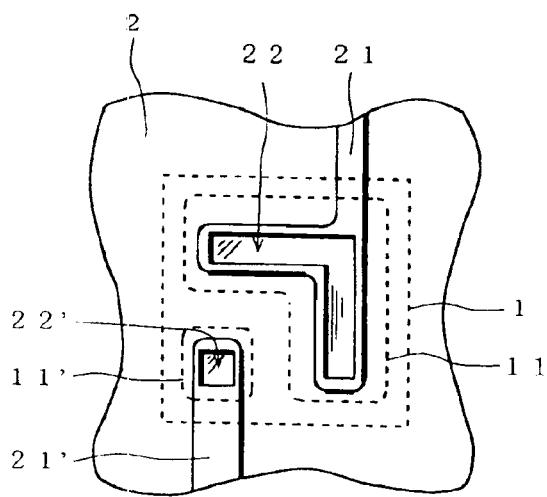
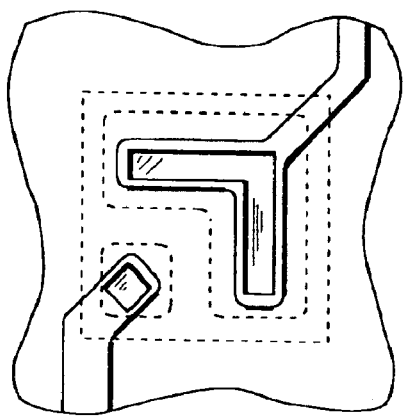
FIG. 2A                                FIG. 2B
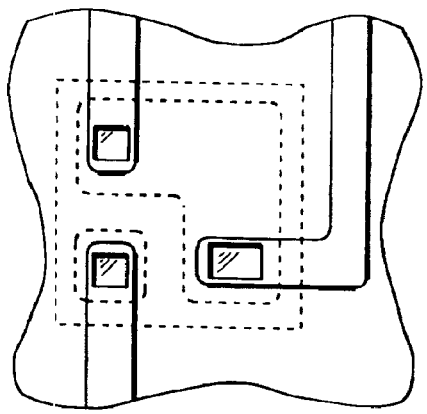
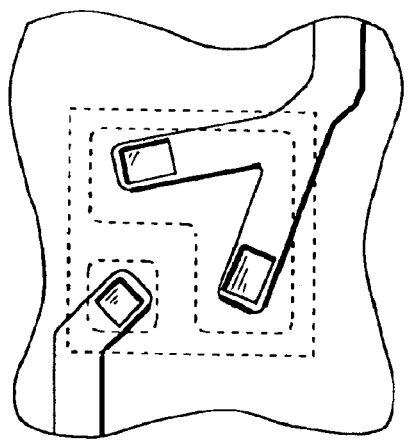
FIG. 2C                                FIG. 2D
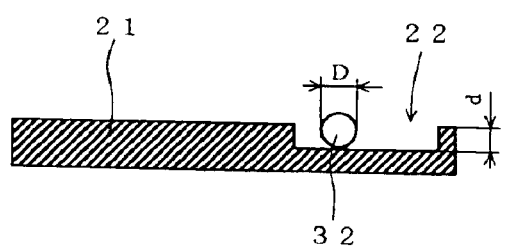
FIG. 3

Prior Art

SEMICONDUCTOR LIGHT-EMITTING DEVICE HAVING A SEMICONDUCTOR LIGHT-EMITTING ELEMENT MOUNTED ON A SUBSTRATE WITH ANISOTROPICALLY CONDUCTIVE ADHESIVE INTERPOSED THEREBETWEEN

BACKGROUND OF THE INVENTION

1. Field of the Invention

The present invention relates to a semiconductor light-emitting device, and more particularly to a semiconductor light-emitting device having a semiconductor light-emitting element (hereinafter also referred to as a light-emitting element) bonded to a substrate by flip-chip bonding using an anisotropically conductive adhesive.

2. Description of the Prior Art

For example, some blue or green light-emitting diode (LED) elements (light-emitting elements) have a structure in which a pair of electrodes, namely a positive and a negative electrode, are formed on the same surface. As shown in FIG. 5, when this type of LED element 1 is mounted on a substrate 2, first the LED element 1 is fixed on the substrate 2 with an adhesive (not shown) such as silver paste, and then a pair of electrodes 12 and 12' formed on the top surface of the LED element 1 are connected, with bonding wires W and W', to wiring electrodes 21 and 21' formed on the substrate 2. In a semiconductor light-emitting device fabricated in this way, while the light emitted upward from the light-emitting layer (active layer) of the LED element 1 exits therefrom through the top surface thereof, the light emitted downward from the light-emitting layer of the LED element 1 is diffusively reflected from the silver paste laid under the bottom surface thereof, so that part of this light is reflected upward so as to exit from the LED element 1 through the top surface thereof.

In the conventional semiconductor light-emitting device structured as described above, on the top surface of the LED element 1, there is formed a current diffusion film 13 as well as the electrodes 12 and 12'. These intercept part of the emitted light, resulting in low light extraction efficiency. Moreover, the bonding wires need to be bent with their sharpest permissible or a less sharp curvature. This makes it difficult to make the device slim.

One way to overcome these inconveniences is, as shown in FIG. 6, to form bumps B and B' on the wiring electrodes 21 and 21' so that, by way of those bumps B and B', the LED element 1 is bonded to the wiring electrodes 21 and 21' on the substrate 2 by flip-chip bonding. In this structure, there is nothing that intercepts the emitted light on the top surface of the LED element 1, i.e., the surface thereof through which the light exits therefrom. This helps increase light extraction efficiency. Moreover, the disuse of bonding wires makes it possible to make the device slim.

However, flip-chip bonding using bumps results in low mechanical strength around where bonding is performed, and thus leads to low reliability. Moreover, bumps need to be formed accurately in predetermined positions on the electrodes of each light-emitting element or on wiring electrodes formed on the substrate. This lowers the productivity and thus the yield of the device. Furthermore, the thickness of bumps themselves is disadvantageous for further slimming-down.

SUMMARY OF THE INVENTION

The present invention has been devised to overcome the above conventionally experienced inconveniences, and it is an object of the present invention to provide a semiconductor light-emitting device that permits highly efficient extraction of light through the top surface of a light-emitting element, that permits further slimming-down of the device, that offers high mechanical strength around where bonding is performed, that permits mounting of the light-emitting element with an ample margin, and that promises high productivity and thus a high yield.

It is another object of the present invention to provide a semiconductor light-emitting device that stably offers high electrical conductivity.

To achieve the above objects, according to one aspect of the present invention, in a semiconductor light-emitting device including a semiconductor light-emitting element having a pair of electrodes formed on the same surface thereof and a substrate having wiring electrodes formed thereon, the semiconductor light-emitting element is mounted on the substrate with an anisotropically conductive adhesive, which has electrically conductive particles dispersion-mixed with a thermosetting resin, laid between the pair of electrodes and the wiring electrodes, and in addition a depression is formed in the portion of the surface of each of the wiring electrodes facing the light-emitting element so that the electrically conductive particles are stably present between the pair of electrodes and the wiring electrodes. This offers high mechanical strength around where bonding is performed, promises high productivity and thus a high yield, and ensures stable electrical conductivity.

According to another aspect of the present invention, in a semiconductor light-emitting device including a semiconductor light-emitting element having a pair of electrodes formed on the same surface thereof and a substrate having wiring electrodes formed thereon, the semiconductor light-emitting element is mounted on the substrate with an anisotropically conductive adhesive, which has electrically conductive particles dispersion-mixed with a thermosetting resin, laid between the pair of electrodes and the wiring electrodes, and in addition the total area over which the electrically conductive particles make direct contact with the wiring electrodes occupies from 10% to 60% of the region over which the wiring electrodes face the light-emitting element. This promises high productivity and thus a high yield, offers high bonding strength between the wiring electrodes and the adhesive, and ensures stable electrical conductivity.

BRIEF DESCRIPTION OF THE DRAWINGS

This and other objects and features of the present invention will become clear from the following description, taken in conjunction with the preferred embodiments with reference to the accompanying drawings in which:

FIGS. 1A and 1B are sectional views of an example of the semiconductor light-emitting device of a first embodiment of the invention;

FIGS. 2A to 2D are plan views of examples of the depressions formed in the wiring electrodes;

FIG. 3 is a sectional view of an example of the depressions formed in the wiring electrodes;

DESCRIPTION OF THE PREFERRED EMBODIMENTS

Figure 4:
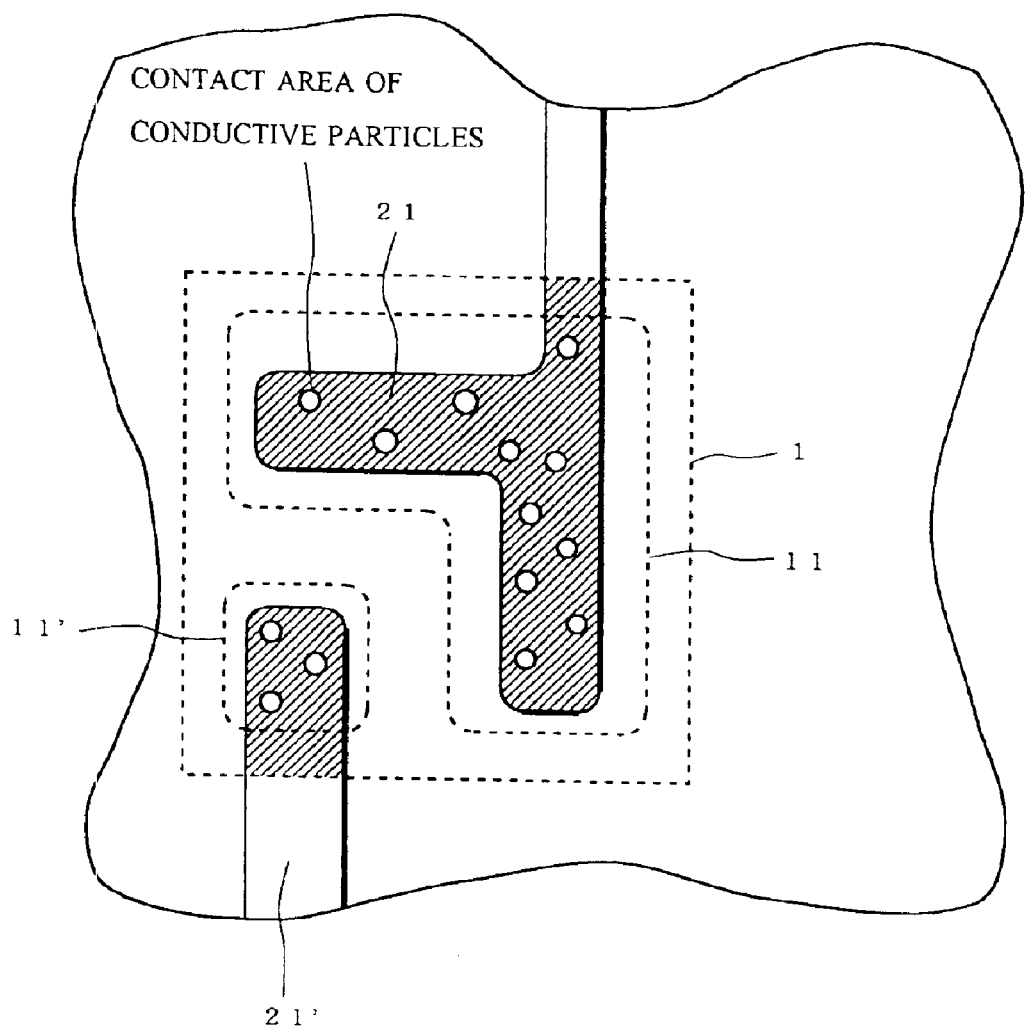
FIG. 4 is a plan view of an example of the semiconductor light-emitting device of a second embodiment of the invention.
Figure 5:
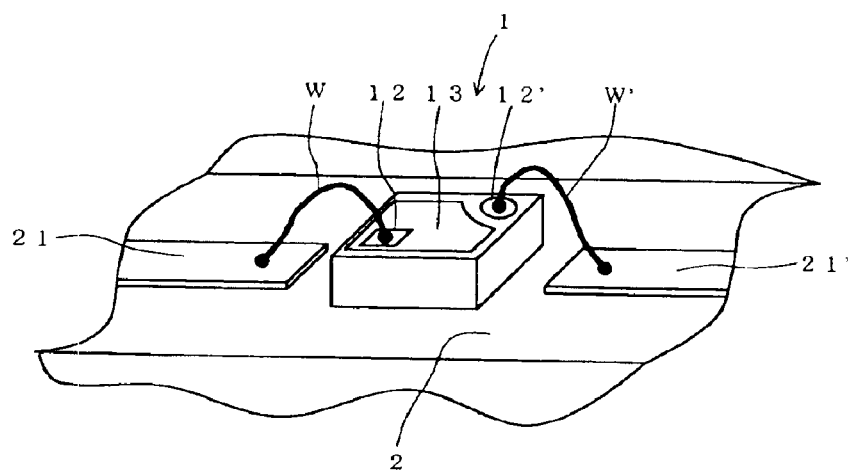
FIG. 5 is a perspective view of an example of a conventional semiconductor light-emitting device.
Figure 6:
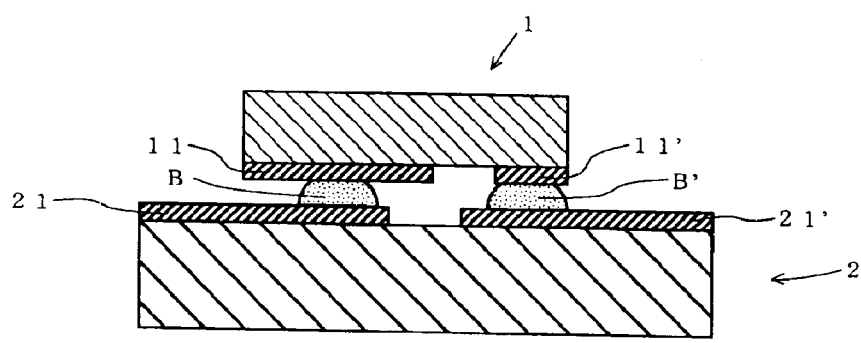
FIG. 6 is a sectional view of another example of a conventional semiconductor light-emitting device.

The inventor of the present invention has made an intensive study in search of a way to improve the low mechanical strength and low productivity conventionally experienced when a semiconductor light-emitting device is fabricated by flip-chip bonding with a view to efficient extraction of light through the top surface of a light-emitting element and slimming-down of the device. Through this study, the inventor has found that, by mounting the light-emitting element on the substrate with an anisotropically conductive adhesive, it is possible to achieve practically high enough mechanical strength and achieve high productivity and thus a high yield, and that, by forming depressions in wiring electrodes, it is possible to effectively prevent electrically conductive particles from escaping from above the wiring electrodes when a pressure is applied to the anisotropically conductive adhesive and thereby achieve satisfactory electrical conductivity. These findings underlay the first embodiment of the present invention.

Hereinafter, with reference to the accompanying drawings, the semiconductor light-emitting device of a first embodiment of the invention will be described. FIGS. 1A and 1B are sectional views of an example of the semiconductor light-emitting device of the first embodiment. As shown in FIG. 1A, an LED element (light-emitting element) 1 has a pair of electrodes 11 and 11' formed on the bottom surface thereof. To prevent short-circuiting between the electrodes 11 and 11', around the edges thereof are formed protective films 14 that are 50 Å to 300 Å thick and made of $SiO_2$, SiN, or the like. On the other hand, on the substrate 2 are formed wiring electrodes 21 and 21'. The wiring electrodes 21 and 21' have depressions 22 and 22' formed in the portion of their top surface facing the electrodes 11 and 11', respectively. On and around the wiring electrodes 21 and 21' is applied an anisotropically conductive adhesive 3 in the form of paste. The anisotropically conductive adhesive 3 has electrically conductive particles 32 dispersion-mixed with a thermosetting resin 31. As the LED element 1 is moved down, it is mounted on the substrate 2 with the anisotropically conductive adhesive 3 laid in between. In this state, the electrodes 11 and 11' are still isolated from the wiring electrodes 21 and 21', respectively.

Then, as shown in FIG. 1B, the LED element 1 is pressed toward the substrate 2 with a predetermined pressure. This causes a maximum pressure to be applied between the electrodes 11 and 11' on the bottom surface of the LED element 1 and the wiring electrodes 21 and 21', respectively. As a result, the electrically conductive particles 32 contained in the anisotropically conductive adhesive 3 which are located between the electrodes 11 and 11' and the wiring electrodes 21 and 21' make contact with one another, and thereby permit the electrodes 11 and 11' to conduct to the wiring electrodes 21 and 21', respectively. On the other hand, elsewhere than at these locations, the electrically conductive particles 32 do not make contact with one another, and thus remain insulating. Here, when the LED element 1 is pressed, the depressions 22 and 22' formed in the portion of the surface of the wiring electrodes 21 and 21' facing the LED element 1 minimize the escaping of the electrically conductive particles 32 contained in the anisotropically conductive adhesive 3 from between the wiring electrodes 21 and 21' the electrodes 11 and 11'. This helps maintain the number of electrically conductive particles 32 present between those electrodes so that a sufficient number of electrically conductive particles 32 make contact with one another when a pressure is applied. In this way, satisfactory conductivity is achieved between the wiring electrodes 21 and 21' and the electrodes 11 and 11', respectively. Now, the thermosetting resin 31 is cured by application of heat to permanently maintain this state.

The depressions 22 and 22' may be formed in any positions on the wiring electrodes 21 and 21' facing the LED element 1, preferably in positions on the wiring electrodes 21 and 21' facing the electrodes 11 and 11'. Accordingly, where to form the depressions 22 and 22' in the wiring electrodes 21 and 21' varies according to the layout of the wiring electrodes 21 and 21' and the shapes of the electrodes 11 and 11' of the LED element 1. FIGS. 2A to 2D show examples of the shapes of the wiring electrodes 21 and 21' and the depressions 22 and 22' as seen in a plan view with respect to the shapes, indicated with broken lines, of the bottom surface and the electrodes 11 and 11' of the LED element 1. Needless to say, any number of depressions may be formed; for example, two or more depressions may be formed in one wiring electrode. To stably fix the LED element 1 on the substrate 2 without inclination, it is preferable to form depressions in at least three positions on the wiring electrodes facing different corners of the bottom surface of the LED element 1 so that the LED element 1 is supported at those three positions.

The depressions 22 and 22' may have any depth, but, if they are too deep, when a pressure is applied, the resulting force between the electrodes may be insufficient to bring the electrically conductive particles 32 into contact with one another. To prevent this, as shown in FIG. 3, it is preferable to give the depressions 22 and 22' a depth d smaller than the particle diameter D of the electrically conductive particles 32. On the other hand, if the depressions 22 and 22' are too shallow, when a pressure is applied, the electrically conductive particles 32 may escape from above the electrodes 21 and 21'. To prevent this, it is preferable to give the depressions 22 and 22' a depth d larger than 1/10 of the particle diameter D of the electrically conductive particles 32. The depressions 22 and 22' may have any conventionally known sectional shape, for example a rectangular, conical, spherical, or other shape. Among these shapes, a rectangular shape is preferred because it effectively prevents the escaping of the electrically conductive particles 32 under application of a pressure and it is easy to form.

The anisotropically conductive adhesive used in this embodiment, which has electrically conductive particles dispersion-mixed with a thermosetting resin, may be of a conventionally known type. Examples of the electrically conductive particles include, to name a few, spherical resin particles plated with Ni or Au, and Ag particles. A preferred range of the particle diameter is from 3 $\mu$m to 10 $\mu$m. Examples of the thermosetting resin include, to name a few, epoxy resin, silicone resin, acrylic resin, and unsaturated polyester resin. Among these, epoxy resin is preferred for its strength and resistance to heat. It is preferable to dispersion-mix from about 1% to about 20% by weight of the electrically conductive particles with the thermosetting resin.

The pressure applied to the LED element is determined appropriately to suit the type and amount of the anisotropically conductive adhesive used, a typical range of the pressure being from about 1 $kg/mm^2$ to about 50 $kg/mm^2$. Preferred conditions under which to heat-cure the thermosetting resin are a heating temperature in the range from 100° C. to 300° C. and a heating duration in the range from 10 s to 120 s.

The anisotropically conductive adhesive may be in the form of paste or in the form of a sheet. In a case where an adhesive in the form of a sheet is used, it is possible to use an adhesive sheet as small as the LED element itself. However, it takes time and trouble to place such an adhesive sheet accurately in a predetermined position on the substrate. To prevent this, as described later, it is common to lay on the substrate an adhesive sheet so large as to cover almost the entire surface of the substrate. This causes part of the light emitted from the light-emitting element to be absorbed by the sheet-form anisotropically conductive adhesive, leading to lower light extraction efficiency. For this reason, it is preferable to use an anisotropically conductive adhesive in the form of paste and apply it only in the portion on the substrate where it needs to be present.

The light-emitting element used in this embodiment may be of any type so long as it has a pair of electrodes formed on the same surface thereof, examples including, to name a few, blue and green LED elements using a sapphire substrate.

The semiconductor light-emitting device of this embodiment can be fabricated by a conventionally known fabrication process. For example, in a case where an anisotropically conductive adhesive in the form of paste is used, first the adhesive is applied, with a pin or dispenser, in each portion where to place a light-emitting element on a substrate having a plurality of wiring electrodes formed thereon, and then the light-emitting element is placed on the adhesive. Then, the light-emitting element is pressed under the pressing conditions described earlier so that the electrodes on the light-emitting element conduct to the wiring electrodes on the substrate, and simultaneously the adhesive is cured by application of heat. Next, the light-emitting element is sealed in a transparent or translucent resin, and then the substrate is cut to separate the individual light-emitting device.

On the other hand, in a case where an anisotropically conductive adhesive in the form of a sheet is used, first a single adhesive sheet is laid on a substrate so as to cover the surface thereof, and then, in each portion thereon where to place a light-emitting element, the light-emitting element is placed. Then, the light-emitting device is pressed so that the electrodes on the light-emitting element conduct to the wiring electrodes on the substrate, and simultaneously the adhesive is cured by application of heat. Next, the light-emitting element is sealed in a transparent or translucent resin, and then the substrate is cut to separate the individual light-emitting device.

Next, the light-emitting device of a second embodiment of the invention will be described. The main feature of this embodiment is that the total area over which the electrically conductive particles make direct contact with the wiring electrodes occupies from 10% to 60 of the region over which the wiring electrodes face the light-emitting element. Hereinafter, with reference to the accompanying drawings, the semiconductor light-emitting device of this embodiment will be described.

FIG. 4 is a plan view of the semiconductor light-emitting device of this embodiment. In this figure, broken lines indicate the profiles of the bonding surface and the electrodes 11 and 11' of the LED element 1. Hatching on the wiring electrodes 21 and 21' indicates their portions facing the LED element 1, and blank circles within the hatched area indicate the area over which the electrically conductive particles 32 make direct contact with the wiring electrodes 21 and 21'. Here, it is important that the total contact area of the electrically conductive particles 32 (indicated by the blank circles) occupy from 10% to 60% of the hatched area.

If the proportion of the total contact area is smaller than 10%, the conductivity between the electrodes 11 and 11' on the LED element 1 and the wiring electrodes 21 and 21' may be insufficient. On the other hand, if the proportion of the total contact area is larger than 60%, while sufficient conductivity between the electrodes is achieved, the bonding strength with the wiring electrodes 21 and 21' may be so weak to cause the anisotropically conductive adhesive 3 to come off the surface of the wiring electrodes 21 and 21'. A more preferred range of the proportion of the total contact area is from 20% to 40%.

The proportion of the total contact area mentioned above can be brought into the range given above, for example, by adjusting the particle diameter and amount of the electrically conductive particles 32 dispersion-mixed with the anisotropically conductive adhesive 3, by adjusting the pressure applied to the LED element 1, or by forming depressions 22 in the wiring electrodes 21 and 21' as described in connection with the first embodiment.

Incidentally, the contact area of the electrically conductive particles 32 is measured in the following manner. The semiconductor light-emitting device in its completed form is split along the surface of the wiring electrodes, and then the area of the electrically conductive particles 32 that are exposed on the surface of the cured anisotropically conductive adhesive 3 facing the wiring electrodes is measured on a scanning electron microscope.

The light-emitting element and the anisotropically conductive adhesive used in this embodiment are the same as those described earlier in connection with the first embodiment.

What is claimed is:

1. A semiconductor light-emitting device including a semiconductor light-emitting element having a pair of electrodes formed on a same surface thereof and a substrate having wiring electrodes formed thereon, the semiconductor light-emitting element being mounted on the substrate with an anisotropically conductive adhesive laid between the pair of electrodes and the wiring electrodes, the anisotropically conductive adhesive having electrically conductive particles dispersion-mixed with a thermosetting resin, wherein a depression is formed in a portion of a surface of each of the wiring electrodes facing the light-emitting element so that the electrically conductive particles are stably present between the pair of electrodes and the wiring electrodes.

2. A semiconductor light-emitting device as claimed in claim 1, wherein a depth of the depression formed in the surface of each of the wiring electrodes is smaller than a particle diameter of the electrically conductive particles.

3. A semiconductor light-emitting device as claimed in claim 1, wherein a depth of the depression formed in the surface of each of the wiring electrodes is greater than 1/10 of a particle diameter of the electrically conductive particles.

4. A semiconductor light-emitting device as claimed in claim 1, wherein the anisotropically conductive adhesive contains from 1% to 20% by weight of the electrically conductive particles dispersion-mixed with the thermosetting resin.

5. A semiconductor light-emitting device as claimed in claim 1, wherein a particle diameter of the electrically conductive particles is in a range of from 3 $\mu$m to 10 $\mu$m.

6. A semiconductor light-emitting device as claimed in claim 1, wherein the substrate is a sapphire substrate.

7. A semiconductor light-emitting device including a semiconductor light-emitting element having a pair of electrodes formed on a same surface thereof and a substrate having wiring electrodes formed thereon, the semiconductor light-emitting element being mounted on the substrate with an anisotropically conductive adhesive laid between the pair of electrodes and the wiring electrodes, the anisotropically conductive adhesive having electrically conductive particles dispersion-mixed with a thermosetting resin, wherein a total area over which the electrically conductive particles make direct contact with the wiring electrodes occupies from 10% to 60% of a region over which the wiring electrodes face the light-emitting element.

8. A semiconductor light-emitting device as claimed in claim 7, wherein the total area over which the electrically conductive particles make direct contact with the wiring electrodes occupies from 20% to 40% of the region over which the wiring electrodes face the light-emitting element.

* * * * *